US012700070B2

(12) United States Patent
Malý et al.

(10) Patent No.: US 12,700,070 B2
(45) Date of Patent: Aug. 4, 2026

(54) METHOD FOR BEAM INTERFERENCE COMPENSATION BASED ON COMPUTER VISION

(71) Applicant: FEI Company, Hillsboro, OR (US)

(72) Inventors: Lukáš Malý, Brno (CZ); Jaroslav Pavliš, Brno (CZ); Jan Klusáček, Brno (CZ); Lukáš Břínek, Brno (CZ)

(73) Assignee: FEI Company, Hillsboro, OR (US)

( * ) Notice: Subject to any disclaimer, the term of this patent is extended or adjusted under 35 U.S.C. 154(b) by 539 days.

(21) Appl. No.: 18/134,528

(22) Filed: Apr. 13, 2023

(65) Prior Publication Data

US 2023/0335371 A1      Oct. 19, 2023

(51) Int. Cl.
| | |
|---|---|
| *G06T 5/73* | (2024.01) |
| *G06T 3/14* | (2024.01) |
| *G06T 5/50* | (2006.01) |
| *G06T 7/30* | (2017.01) |
| *H01J 37/24* | (2006.01) |
| *H01J 37/28* | (2006.01) |

(52) U.S. Cl.
CPC .................. *G06T 5/73* (2024.01); *G06T 3/14* (2024.01); *G06T 5/50* (2013.01); *G06T 7/30* (2017.01); *H01J 37/24* (2013.01); *H01J 37/28* (2013.01); *G06T 2207/10061* (2013.01); *H01J 2237/221* (2013.01)

(58) Field of Classification Search
CPC ......... G01N 23/2251; G06T 3/14; G06T 5/50; G06T 5/73; G06T 7/0002; G06T 7/30; G06T 2207/10056; G06T 2207/10061; H01J 37/153; H01J 37/00; H01J 37/02; H01J 37/26; H01J 37/222; H01J 37/24; H01J 37/28; H01J 2237/221

USPC .......................................... 250/306, 307, 311
See application file for complete search history.

(56) References Cited

U.S. PATENT DOCUMENTS

| | | | |
|---|---|---|---|
| 2007/0098291 A1 | 5/2007 | Niikura et al. | |
| 2012/0104253 A1* | 5/2012 | Tsuneta ................. | H01J 37/263 |
| | | | 250/307 |
| 2016/0163501 A1 | 6/2016 | Yamada | |

(Continued)

OTHER PUBLICATIONS

Application No. EP23167788.1, Extended European Search Report, Mailed On Sep. 11, 2023, 9 pages.

(Continued)

*Primary Examiner* — Jason L Mccormack
(74) *Attorney, Agent, or Firm* — Leron Vandsburger

(57) ABSTRACT

The present invention relates to a method and a system for compensating interference in a charged particle beam microscopy system. A step of capturing data obtained from irradiation of a sample for a sampling duration can be implemented. In the system a respective data storage is provided for capturing and/or storing this data. Further steps of dividing at least representative parts of the sampling duration into time-windows and constructing, for each of the time-windows, an intermediate image, can be implemented. Detecting shift between the intermediate images and determining a compensation function for the shift between the intermediate images is realized as well. In a system the latter steps are automated by a respective processing component. The shift between intermediate images can be a two-dimensional shift and the compensation function represents a shift of the intermediate images in the two dimensions over time.

20 Claims, 7 Drawing Sheets

(56) References Cited

U.S. PATENT DOCUMENTS

| | | | |
|---|---|---|---|
| 2020/0242744 A1* | 7/2020 | Schafer | G06T 5/70 |
| 2021/0035272 A1* | 2/2021 | Yao | H04N 23/81 |
| 2021/0319537 A1* | 10/2021 | Hiasa | G06N 3/09 |

OTHER PUBLICATIONS

Pluska et al., "Software Methods for Identification and Compensation of Electron Beam Vibration in SEM", Autumn School on Materials Science and Electron Microscopy, Available Online at: http://crysta.physik.hu-berlin.de/as2005/pdf/2p_abstract_pluska.pdf, Oct. 2005, 2 pages.

* cited by examiner

METHOD FOR BEAM INTERFERENCE COMPENSATION BASED ON COMPUTER VISION

FIELD

The present invention is related generally to the field of microscopy systems. More particularly, it is related to correction of interference in a charged particle beam microscopy system.

BACKGROUND

Charged particle beam microscopy systems, such as electron or ion beam microscopes, are widely used for imaging and/or fabrication of micro/nanoscopic systems. Their key advantage over optical microscopy systems is their higher resolution deriving from the non-zero mass of particles in the imaging beam. However, even for charged particle microscopy systems resolution limits are typically much higher than expected from the shorter wavelength of massive particles. This may be, among other factors, because of aberrations of the microscopy system or because of external disturbances that affect the microscopy system. For example, if the microscopy system comprises a scanning electron microscope (SEM) it may have a resolution of ~1 nm. For such a microscopy system, even external disturbances that result in displacements of tens of nm may be relevant. A typical external disturbance for electron microscopes may be, for example, oscillations of the electromagnetic energy being delivered through the electricity supply grid. The oscillations of the current being delivered via the grid may cause deflection of the electron beam and thus adversely effect the quality of the image. Similarly, the specimen is held on a stage in such microscopy systems. Mechanical disturbances of the microscopy system may lead to a displacement of the stage and thus, also affect the quality of the images acquired.

Typical methods for avoiding effects of such external disturbances on the imaging process may comprise a dedicated apparatus that may be used to generate, for example, compensating electric/magnetic fields that cancel the effects of the external disturbance. Such systems are widely used, see, for example, products by Spicer®. While they do solve the problem of compensating for external disturbances, such apparatus may be complex and require dedicated expertise to operate. Further, they may require additional energy and time to operate, rendering the overall imaging process inefficient.

SUMMARY

It is an aim of the present invention to provide an alternative method and device for correcting or compensating effects caused by external disturbances or interferences. This aim is attained with the subject matter in accordance with the claims and embodiments.

The present invention seeks to overcome or at least alleviate the shortcomings and disadvantages of the prior art. More particularly, it is an object of the present invention to provide a method and system that allows for an improved resolution of a microscopy system by correcting effects from external disturbances. It can provide a simple and easy use and efficient use.

Embodiments of the present technology can be directed particularly to periodic external disturbances or interference(s) such as those described above. Embodiments of the present technology further aim to provide a method that may ensure reliable correction of periodic external interference that operates on the level of raw data and not on analog data or the final image. The correction can be done in real time, on the fly or quasi in real time.

The present invention relates to a method, system and computer program product that is configured to compensate or correct interference, such as one or more external interference(s) in microscopy, such as in charged particle beam microscopy or microscopy systems. Whenever method steps are mentioned also respective system features enabling these steps are embraced or disclosed by the present disclosure and vice versa.

The term compensation is intended to comprise an incomplete correction compensating the interference at least in part or a complete correction thereof and anything in-between. This can depend on the computing power and/or time invested and the needs of a user. The grade of compensation can be pre-defined and/or variable and/or pre-set.

The interference can be an external interference, such as an alternating current/AC-triggered interference or an internal interference within the microscope or a combination thereof.

According to the present invention, data is obtained and captured based on irradiating a sample or its surface over a sampling duration. The capturing can be a storing, a preliminary storing, an acquiring of the data. This data captured can comprise what is usually called raw data. However, also raw data can be compressed or pre-computed, it is however not the final data for generating a specimen image or the final specimen image stream. This data captured also comprises position/location-relevant information that can be preferably corrected, such as the position of one or more beam(s) and/or of the table or holder holding a specimen.

At least representative one or more part(s) of the of the sampling duration are divided into parts, slices, sections or time-windows. The time-windows don't have to be continuous. The whole sampling duration can be divided into parts, slices, sections or time-windows, such as N time-windows adding up to the whole sampling duration, or a representative number or choice of time-windows. The latter is possible in case the nature of the interference is known already, such as the AC-triggered interference with a known frequency, knowing that a sinusoidal function can represent such interference and just the phase and amplitude needs to be detected. With this as a non-limiting example it would be sufficient to take two or three time-windows within one period (obtained as the inverse of the known frequency) of the AC-triggered interference. With sufficient computing power and/or time the whole sampling duration can be analyzed as well and as mentioned before. In more complex periodic functions, more time-windows may be necessary. An algorithm could be configured to pre-define the necessary representative time-windows and nevertheless time and/or computing efforts can be minimized by not being forced to process the entire sampling duration.

An intermediate image from the data captured for each of the at least representative time-windows can be constructed or created and a shift between these intermediate images can be detected.

The term intermediate image is intended to comprise an image with at least sufficient information to detect, determine, analyze and/or measure the shift or a number of shifts between the intermediate images of different time-windows. This can comprise a low-resolution image or even indexed points in an image allowing for the determination of shifts of the images. In case of two-dimensional images also two dimensions of the shifts are detected. It can also happen that only a one-dimensional shift is detected although a two-dimensional sample has been analyzed and the respective data has been captured over the two dimensions.

In order to provide an improved static image, the intermediate images can be aligned and integrated or aggregated in order to enhance resolution. For that the intermediate images can be computed in their full resolution, in reduced resolution, in high resolution for a specific illumination in order to be integrated to an improved image. The improvement can be in an enhanced resolution, a higher dynamic range, an improved sharpness or any combination thereof.

The invention is also directed to a respective microscopy system for compensating interference that can comprise a data storage configured for capturing and/or storing data obtained from irradiation of a sample for a sampling duration, and a processing component configured for dividing at least representative parts of the sampling duration into time-windows, for constructing a intermediate image from the data captured for each of the time-windows, and for detecting shift(s) between the intermediate images.

All those steps described before and below are performed in an automated fashion.

In the system the processing component is particularly configured for performing any of the method steps referred to above and below.

This detection of shift over time can then be used for compensating the interference in a charged particle beam microscopy system. This can also comprise determining a compensation function for the shift between the intermediate images. As mentioned before and below, this is usually a function of one, usually two or three dimensions of shifts between the time-windows and the respective fitting of a function or extrapolation over time. The respective shift values over an entire sampling duration and/or the next sampling duration can be computed with the data captured in order to compensate the interference. Therefore, the shifts over time represented by the compensation function can be subtracted, deduced or deducted from the data captured or in any way to be able to compensate the interference. This data captured can comprise position and/or location data of a beam and/or the sample holder or table in a microscopy system. At the end a stabilized image is provided on the basis of the raw data with the subsequent compensation or correction.

The compensation function can be a periodic function as usually the interference can be a periodic phenomenon as well. The period of the periodic function may be determined. An intermediate image for a defined time-window may then be constructed also using data captured in time intervals of the same duration as the defined time-window and separated from the defined time-window by an integral multiple of the period. When using the data from these later time intervals, the data may be aggregated, for example, by averaging. As may be appreciated, other appropriate means of data aggregation may also be employed as long as the means are employed consistently.

The compensation function is a trigonometric function, such as a sinusoidal function with amplitude and phase data. As mentioned, such sinusoidal function can then serve as the compensation function for correcting position or location information in the data captured, such as the position or location data of the charged particle beam in a respective microscope over the time captured or the sampling duration.

The compensation function can also be composed of more than one interference resulting in a more complex function.

The method can also comprise the step of generating compensated image data on the basis of the data captured with a compensation of the interference according to the compensation function and then generating and/or displaying an image with the interference being compensated.

A further step of tracking the compensation of interference continuously and benchmarking the quality thereof can also be implemented. A benchmark can be any indicator or value for the quality of an appropriate compensation of interference. In an optimum the interference can be completely compensated and is not apparent in the further image data or image. This quality or benchmark can be monitored in intervals or continuously and in in case it slips or moves or steps over a threshold to the negative a re-adjustment or re-compensation can be triggered.

The compensation quality or its benchmark threshold can be pre-set or the precision can be pre-set according to the precision of an experiment needed or considered appropriate. the benchmark can instead or additionally comprise a dynamic or relative value depending on the ratio of values of the data captured to the values of the shifts determined.

A step of convolving at least two of the intermediate images can be also added.

A step of defining a reference time window and with further tabulating each of the shifts as a function of the time difference with respect to the reference window can be realized.

A machine learning method can be also implemented in order to optimize any interference compensation that can also be computed remotely, such as in the cloud, with the result being fed (back) into the microscope.

The microscope being a charged particle beam microscope can be configured to provide an energy for the particles in a beam with at most 50 keV, preferably at most 40 keV, further preferably at most 30 keV. The beam of particles can comprise a current of up to 19 pA for a beam energy of 15 keV, and up to 350 pA for a beam energy of 30 keV.

The microscopy system can be configured to direct a beam of particles at a scan point on the sample to image it. A result of the beam of particles striking the sample corresponds to an emission of particles from the sample. A detector in the system can be configured to detect emissions from the sample. The particles can comprise electrons. The detector can be configured to detect a particle flux.

The data storage can be configured to store data relating to the particle flux. The microscopy system according to the preceding embodiment wherein the data relating to the particle flux comprises the 2-dimensional co-ordinates of the scan point.

The data relating to the particle flux can comprises data relating to a time of detection of the particle flux. The data processing unit can be configured to exchange data with the data storage or a memory unit.

BRIEF DESCRIPTION OF THE DRAWINGS

Further potential and thus non-limiting features, details and advantages of the invention will be discussed in the following drawings.

DETAILED DESCRIPTION

For the sake of clarity, some features may only be shown in some figures, and others may be omitted. However, also the omitted features may be present, and the depicted and discussed features do not need to be present in all embodiments.

Figure 1:
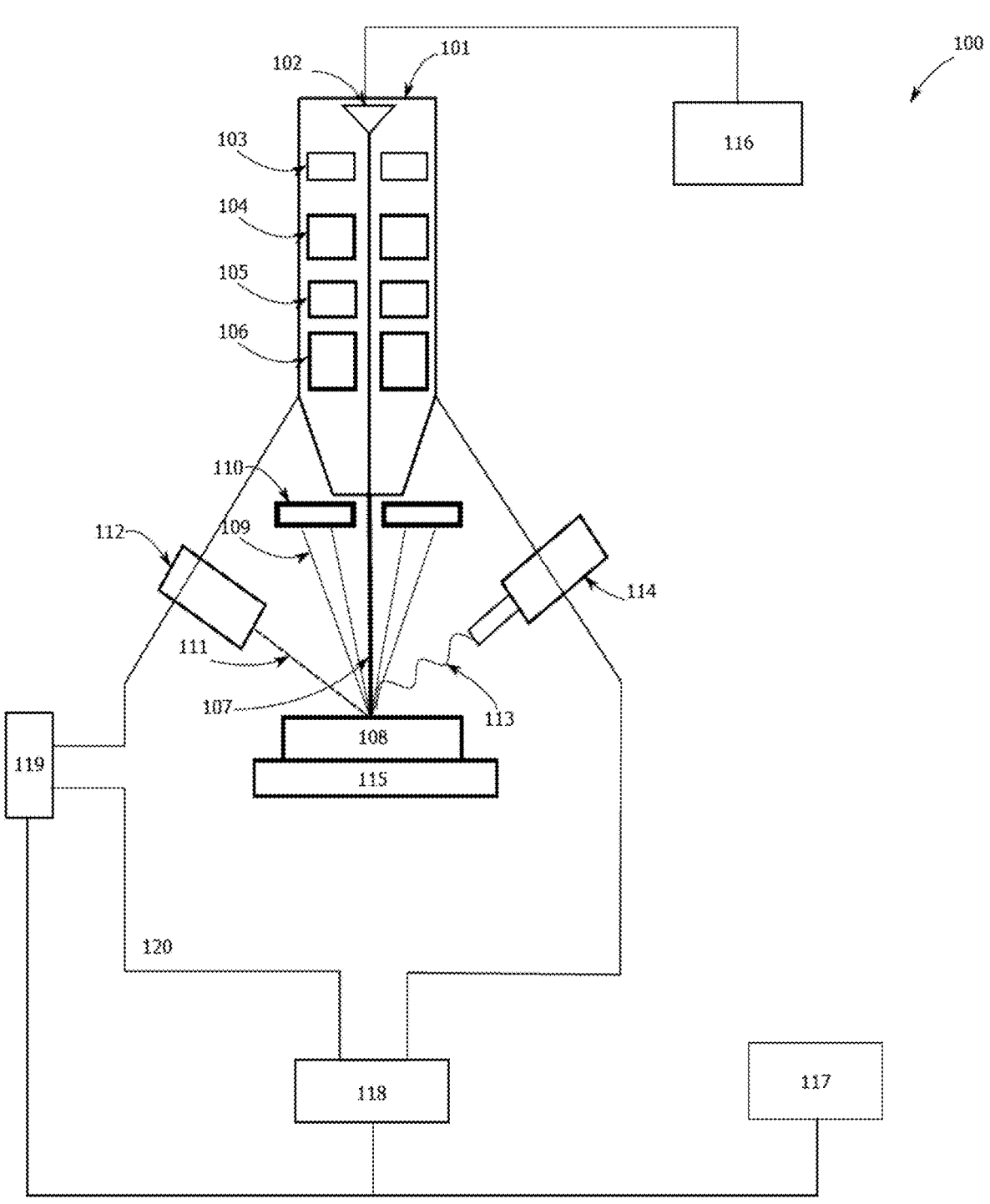
FIG. 1 shows an embodiment of a scanning microscopy system according to the invention.

FIG. 1 shows components of a scanning microscopy system 100. The scanning microscopy system 100 may be configured for generating a primary beam 107 of charged particles (e.g., electrons or ions). The scanning microscopy system 100 may be further configured to direct the primary beam 107 of charged particles on to a sample 108. The scanning microscopy system 100 may comprise, for example, a Scanning Electron Microscope (SEM) 101.

In this example, the primary beam comprises an electron beam 107. The electron beam 107 may be generated by an electron source 102 configured for emitting the electron beam, wherein a voltage may be applied between the electron source 102 and an anode 103. The applied voltage may preferably range from at least 0.1 kV to at most 30 kV. The scanning microscopy system 100 may further comprise a directing and/or focusing assembly that may comprise, for example, electromagnetic lenses. The electromagnetic lenses may be configured for controlling the path of the electron beam 107. At least one condensing lens 104 may be comprised by the electromagnetic lenses. The condensing lens 104 may be configured for controlling the size of the beam 107. Moreover, at least one objective lens 106 may be comprised by the electromagnetic lenses. The objective lens 106 may be configured for focusing the electron beam 107 to a scan point on the sample 108. The scan point may correspond to an electron spot on the sample 108. Further, the dimensions and the shape of the scan point may depend on the focusing properties of the electromagnetic lenses (e.g., applied current) and the working distance between the SEM 101 and the sample 108. A scanning coil 105 may be configured for deflecting the ion beam 107 over a plurality of scan locations in one or two dimensions. Thus, as an optional advantage, this may enable a two-dimensional scanning of the sample. The scanning coil 105 may be magnetic and/or electrostatic.

The scanning microscopy system 100 may be configured for detecting first and second emissions 109, 111, 113. The electron beam 107 may interact with particles (such as atoms) of the sample 108. This interaction may result in the first and second emissions. The first emissions may comprise emissions of charged particles, such as secondary electrons and/or secondary ions. The first emissions may also comprise emissions of backscattered, transmitted and/or Auger electrons. Further, the second emissions may comprise emissions of photons across a range of wavelengths, such as X-rays and/or light (e.g., visible light).

In the example of FIG. 1, the scanning microscopy system 100 may comprise a first detector 110, wherein the first detector 110 may be configured for detecting backscattered electrons 109 emitted from the scan locations in a sequential manner. Thus, the first detector 110 may comprise a backscattered electron detector, such as a segmented silicon drift detector.

However, the backscattered electron detector may also correspond to other types of solid-state detectors. Moreover, the scanning microscopy system 100 may comprise a second detector 112, wherein the second detector 112 may be configured for detecting secondary electrons and/or secondary ions 111 emitted from the scan locations in a sequential manner. Thus, the second detector may comprise a secondary electron detector, such as an Everhart-Thornley detector. The second detector may alternatively or additionally comprise a secondary ion detector, such as a charged particle multiplier.

Further, the scanning microscopy system may comprise a third detector 114, wherein the third detector 114 may be configured for detecting photons emitted from the scan locations in a sequential manner. Thus, the third detector 114 may comprise, for example, an X-ray detector, wherein the X-ray detector may comprise, for example, a silicon drift detector. However, the third detector 114 may also comprise other types of photon detectors (e.g. scintillation detectors). The second and the third detector 112, 114 may be tilted with respect to the surface of the sample 108.

The third detector 114 may be comprised by an energy-dispersive spectrometer (EDS). The energy bandwidth of the EDS may range from 0 to 17 keV. In another modality the third detector 114 may be comprised by a wavelength-dispersive spectrometer (WDS). Further, the third detector 114 may also be comprised by an electron energy loss spectrometer or a cathodoluminescence spectrometer.

The sample 108 may be positioned on top of a movable stage 115. The movable stage 115 may be configured for performing two horizontal movements, a vertical movement, a tilting movement, and/or a rotational movement, with respect to the plane of the sample 108. The two horizontal movements may comprise selecting a field of view. The vertical movement may comprise changing the height of the sample 108 and thus the depth of focus and/or the image resolution.

The scanning microscopy system 100 may further comprise a control unit 116. The control unit 116 may be configured for controlling the power supply and operation of the condensing lens 104, the objective lens 106, the scanning coil 105 and the movable stage 115. Further, the scanning microscopy system 100 may comprise a vacuum system. The vacuum system may comprise a vacuum controller 117, a mechanical pumping system 118, an ultra-high vacuum pump 119 (such as an ion pump) and a vacuum chamber 120. The vacuum controller 117 may be configured for controlling the operation of the mechanical pumping system 118 and the ultra-high vacuum pump 119. The mechanical pumping system 118 and the ultra-high vacuum pump 119 may be configured for providing an ultra-high vacuum within the vacuum chamber 120. The vacuum chamber 120 may be configured for housing the sample 108, the movable stage 115, the first detector 110 or parts thereof, the second detector 112 or parts thereof, the third detector 114 or parts thereof, and the SEM 101 or parts thereof.

The scanning microscopy system 100 may be configured to position the beam 107 over a defined scan point (pixel) on the sample 108. This defined pixel may be fed into the microscopy system 100 and the beam 107 be positioned appropriately by the electromagnetic lenses. The beam 107 may be configured to stay at the defined pixel for a defined dwell time, which may also be fed into the system 100. A larger dwell time may lead to a higher signal to noise ratio at the cost of a larger overall time needed for imaging the sample 108. The time needed for the microscopy system 100 to image the scan point on the sample 108, that may be called a sampling period, may be shorter than the dwell time such that a plurality of samples of the sample point may be obtained over the course of the dwell time. As may be appreciated, the larger the number of such samples, the higher is the signal-to-noise ratio. In general, a total of N samples may be made at the defined pixel.

Figure 2:
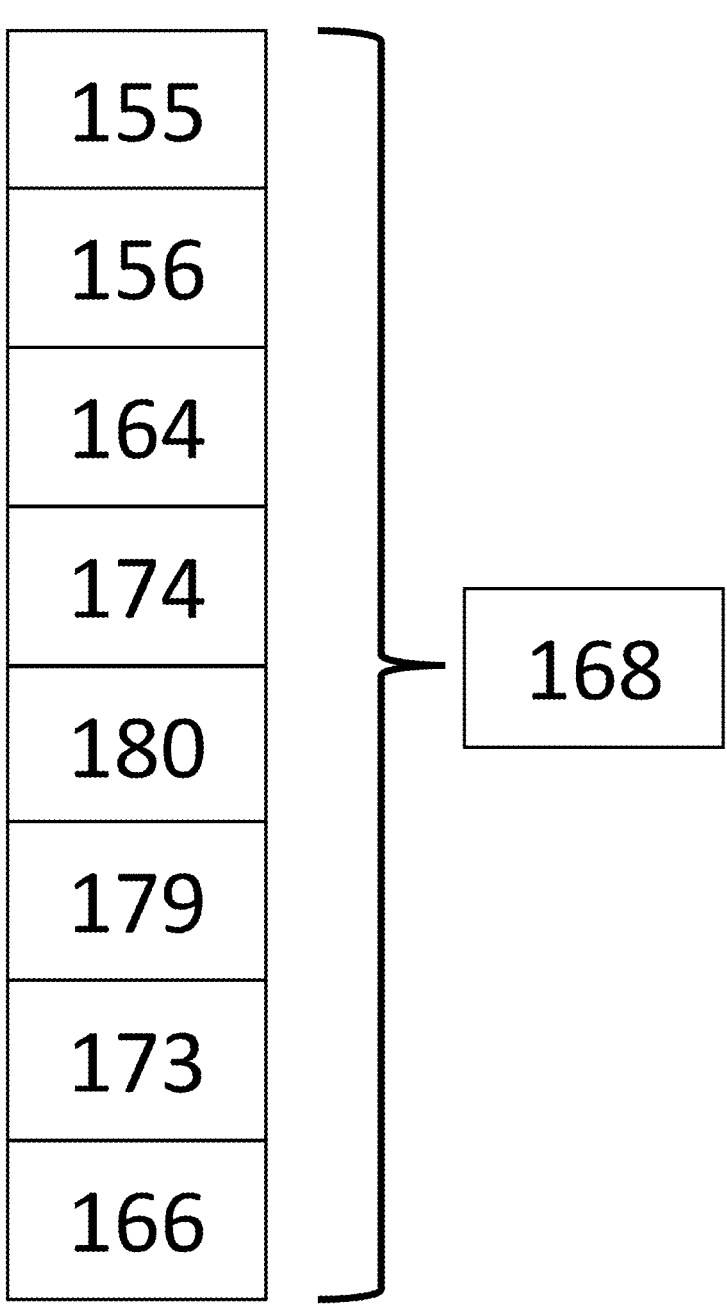
FIG. 2 depicts an exemplary scanning process in accordance with the present invention.

FIG. 2 depicts an exemplary scanning process where the dwell time is 200 ns, and the sampling period is 25 ns (corresponding to a sampling frequency of 40 MHz) such that N=8 samples (=200/25) are taken at the defined pixel. Note that with the same configuration of dwell time and sampling period, N=8 samples are made for the whole sample 108. FIG. 2 further depicts the results $R_1$, $R_2$, . . . , $R_8$ of the 8 samples (with 8-bit precision). For example, $R_1$ through $R_8$ may represent counts of charged particles, such as secondary and/or backscattered electrons, emitted by the sample 108 and detected in the detector 110. The counts that are captured for use in the final captured image for the defined pixel may then be obtained by averaging the N (=8) samples to obtain $R_i$ which in the depicted example is 168.

A consequence of the dwell time may be that an external interference may affect the imaging process. For example, the external interference may comprise interference from the electricity grid, comprising a frequency of 50 Hz, that supplies energy to households. Or, such an external interference may comprise mechanical disturbances that affect the position of the sample 108 via displacements of the stage 115. As a result of this external interference, the actual position of the scan point (or where the beam 107 hits the sample 108) may be different from the pixel reported by the microscopy system 100 that may still report the defined pixel that was fed into it. This may adversely affect the imaging process with incorrect counts being measured for the defined pixel. For example, if the external interference is periodic, the average value, $R_i$, of the counts may represent the average of counts over different points of the sample 108 around the defined pixel. A consequence of this is illustrated in FIG. 3 that depicts the result of averaging over counts from each scan of the sample 108.

Figure 3A:
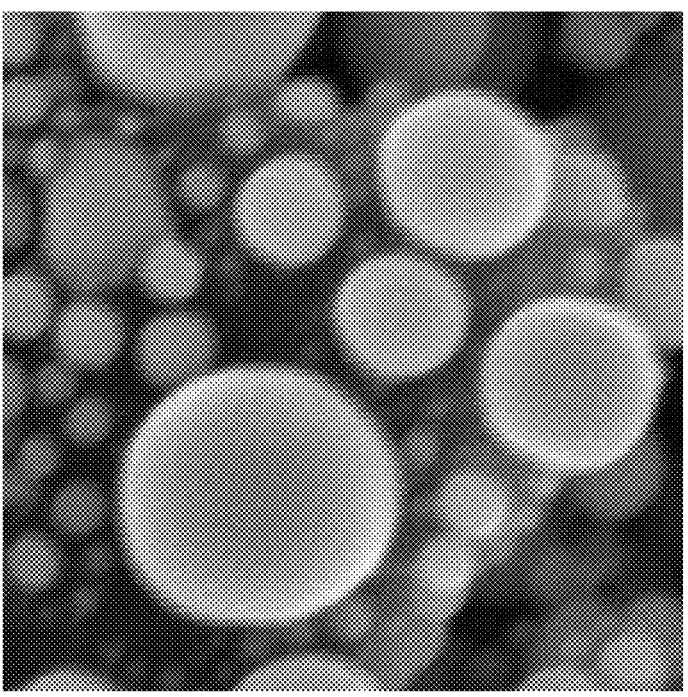
FIG. 3a depicts the result of averaging over the counts from each scan of a sample.
Figure 3B:
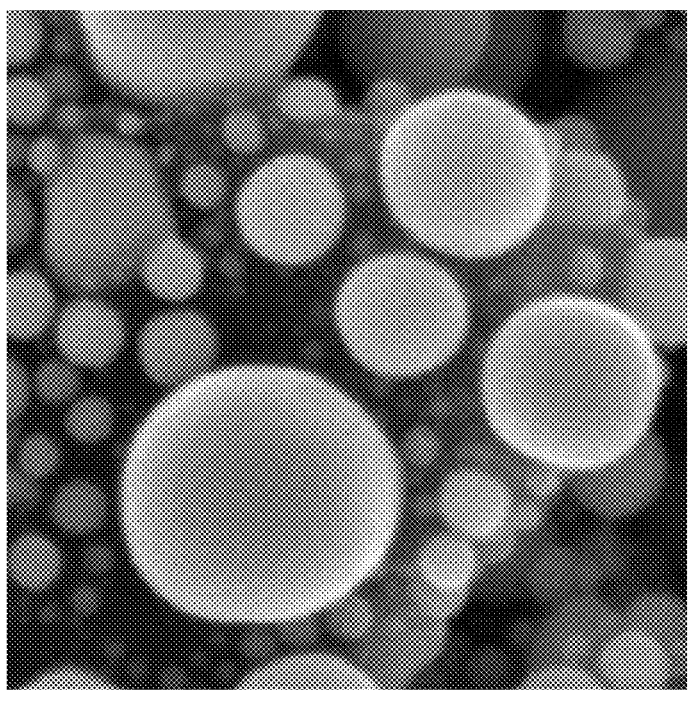
FIG. 3b shows a result after correcting for the external interference employing an embodiment of the present technology.

FIG. 3a depicts the result of averaging over the counts from each scan of the sample 108. The result is a blurred image of sample 108. FIG. 3b depicts the result after correcting for the external interference employing an embodiment of the present technology. As may be appreciated, the image of the sample 108 is much sharper and the overall resolution of the image is thus improved. Embodiments of the present technology thus aim to provide a method to correct for external disturbances that may allow for improved resolution of the microscopy system 100. They are directed, in particular, to correct and/or compensate an interference arising from periodic, such as sinusoidal external disturbances of a defined frequency, that may be called the interference frequency. In embodiments of the present technology, this interference frequency may be additionally determined. For the description below, it is assumed that the interference frequency is known.

Figure 4:
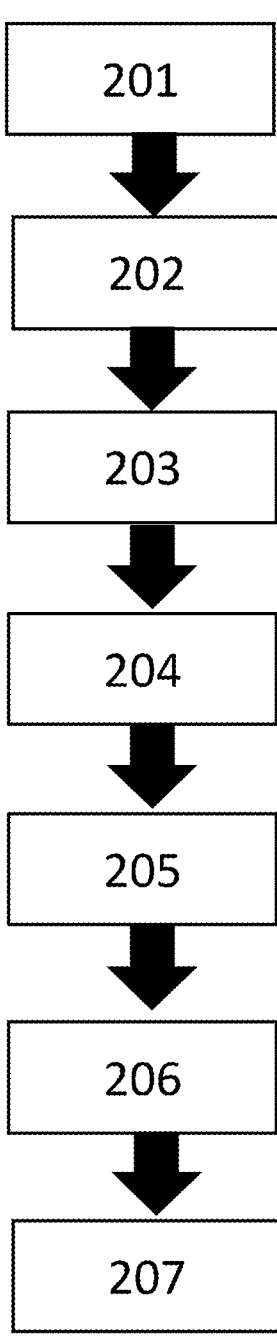
FIG. 4 depicts an exemplary embodiment of the method according to the present invention.
Figure 5A:
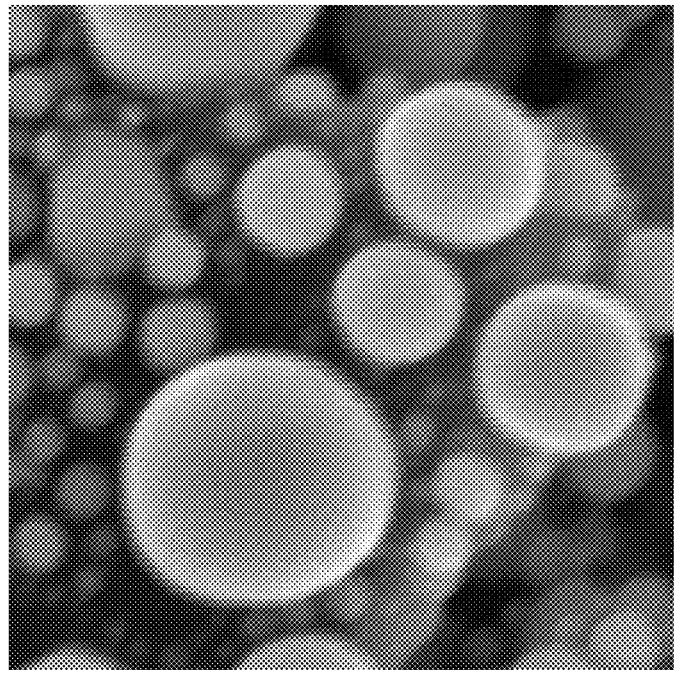
FIG. 5a exemplifies a picture with raw data captured.
Figure 5B:
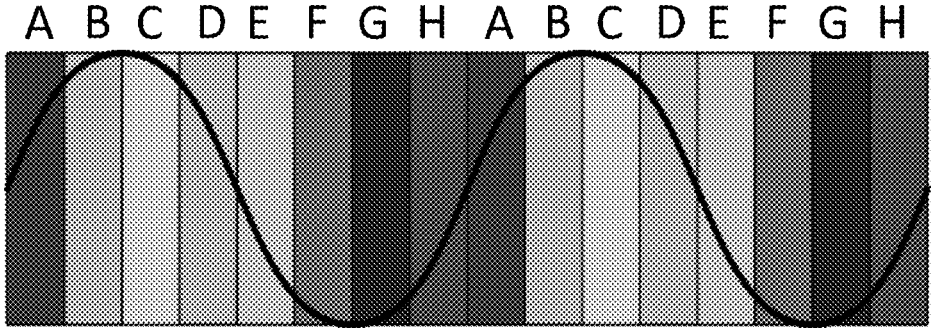
FIG. 5b exemplifies two time periods of a sine wave depicting an external interference signal.
Figure 5C:
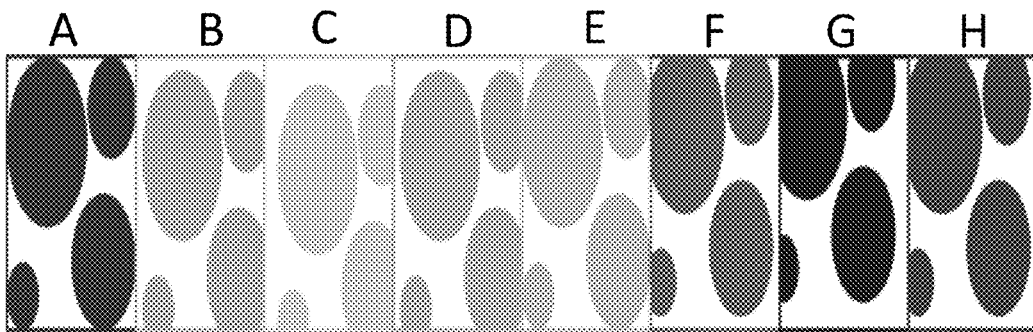
FIG. 5c depicts examples of intermediate images that are constructed according to the present invention.
Figure 5D:
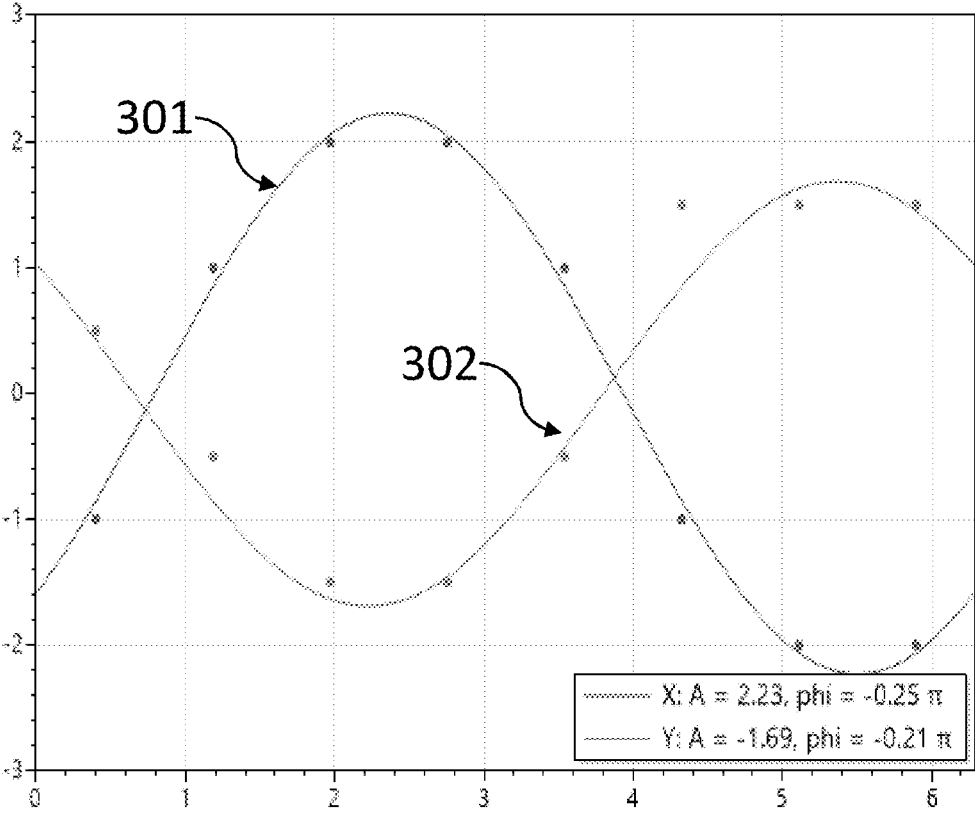
FIG. 5d exemplifies shifts determined by convolving the intermediate images with each other.
Figure 5E:
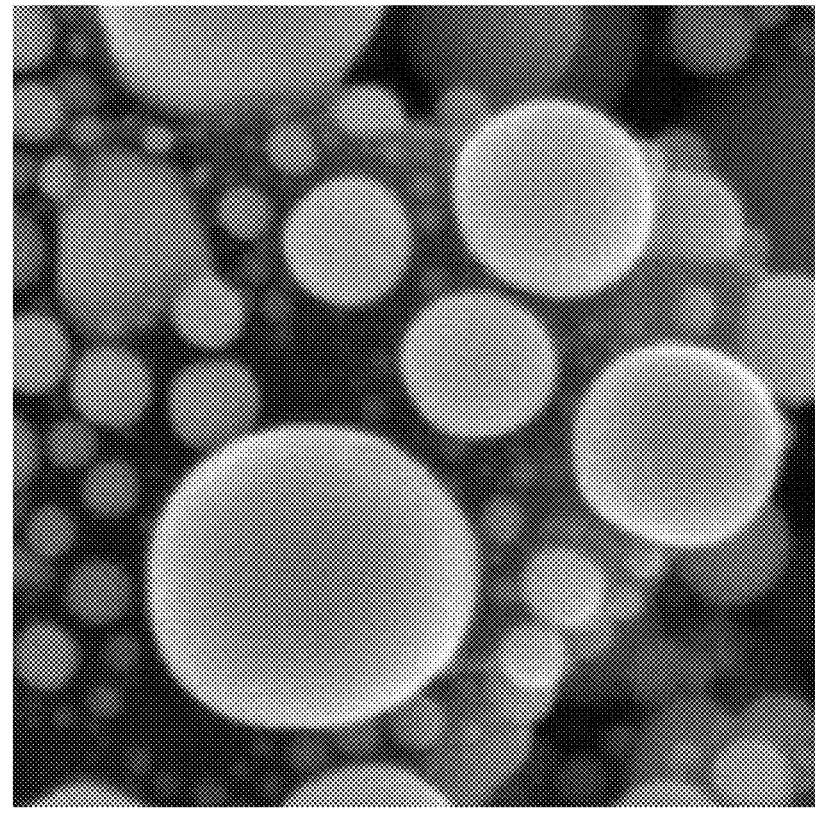
FIG. 5e depicts the reconstructed image obtained after subtracting the fitted sinusoidal functions depicted in FIG. 5d.

FIG. 4 depicts an exemplary embodiment of the method according to the present invention. The embodiment depicts a plurality of steps that may comprise the method according to the present invention. A first step, 201, may comprise capturing the raw data from imaging the sample 108. Raw data may comprise the data captured from each of the N samples as described above. Typically, only the average of the values from the N samples may be captured. However, to carry out the method according to the present invention, all the values from each of the N samples may be or are actually preserved.

In a next step, 202, the known period of the interfering signal, $T_i$, (from the interference frequency) is divided into M parts/windows, so that each part has a duration $\Delta T = T_i / M$. Note that M may be different from N. Further, it is also assumed that the total duration, D, that may be called a sampling duration, over which data is captured while imaging the sample 108 is larger than the time period $T_i$. Thus, data acquisition may happen over multiple time periods of the interfering signal. As described above, each of the $D/T_i$ (that may be defined to be equal to K) periods of the interfering signal is then divided into M parts.

The next step, 203, comprises constructing an intermediate image out of corresponding parts of the K periods. For example, an intermediate image may be constructed out of data captured in the first $\Delta T$ time, data captured in $\Delta T$ time after $T_i$, data captured in $\Delta T$ time after $(2 \times T_i)$, and so on. In other words, corresponding windows of time are identified in each of the K periods and data captured in each of the corresponding windows is used to construct the intermediate image. The K data elements for each window may be combined to construct the intermediate image by, for example, averaging them. Alternatively, they may simply be summed together. The intermediate image may comprise data from different regions of sample 108 and may depend on the position of the beam 107 at the corresponding time-windows. Thus, at the end of step 203, M intermediate images may be obtained.

Step 204 comprises detecting effects of the external interference based on the intermediate images. This may be achieved by, for example, convolving the intermediate images among themselves. For example, the intermediate image constructed from the first window may be convolved with the intermediate image constructed from the second window, and so on. Based on this convolution, a shift of the intermediate images may be obtained. The shift may comprise a two-dimensional vector with values in an x-direction and a y-direction. The x- and y-directions may correspond to directions along translation axes of the stage 115.

One of the M time-windows (if M time-windows are used) may be chosen as a reference window. The shifts along the x- and y-directions may then be plotted as a function of the time difference from the reference window. For example, the shifts obtained from convolving the intermediate image from the first window with the intermediate image from the second window may be captured corresponding to $\Delta T$. Similarly, the shifts obtained from convolving the intermediate image from the first window with the intermediate image from the third window may be captured corresponding to $2 \times \Delta T$. Further, the shift obtained from convolving the intermediate image from the second window with the intermediate image from the third window may be (vectorially) added to the shift from convolving the intermediate image from the first window with the intermediate image from the second window and captured corresponding to $2 \times \Delta T$. When multiple shifts are captured for the same time difference, as described above, the values may be averaged over. The end result of step 4 may be a graph depicting the shifts in x- and y-directions as a function of the time difference from the reference window.

The next step, 205, may comprise fitting the shift data obtained in step 204 with a periodic function to obtain the parameters of the interference model. Once the interference model has been thus determined, in step 206 the interference signal may be subtracted from the reported positions of the beam 107 to obtain data corresponding to actual positions on the sample 108. In a final step 207, this data may be used to reconstruct the image. Thus, one may go from the blurry image of exemplary sample 108 shown in FIG. 3*a* to the sharp image shown in FIG. 3*b*.

FIG. 5 illustrates the above steps 201 to 207 for an exemplary sample 108. FIG. 5*a* shows step 201, which depicts the raw data that may be captured. FIG. 5*b* shows a scan comprising two (2) time periods of an exemplary sine wave depicting an external interference signal with each period divided into 8 parts/time-windows, labelled A to H. Thus, $M=8$, $K=2$, and $D=2 \times T_i$. FIG. 5*c* depicts the 8 intermediate images that may be constructed using each of the 8 windows. FIG. 5*d* depicts the X (301) and Y (302) shifts determined by convolving the 8 intermediate images with each other. It also depicts the sinusoidal functions fitted to each of the shifts with corresponding values for the phase and amplitude. Finally, FIG. 5*e* depicts the reconstructed image obtained after subtracting off the fitted sinusoidal functions depicted in FIG. 5*d*. In particular, for each point in time, the X and Y shifts may be estimated from the fitted sinusoidal function and then be subtracted from the captured x- and y-coordinates of the scan point.

Note that while the above disclosure has focused on sinusoidal periodic disturbances, the method according to the present invention may also be applied to correct for disturbances of any functional form as long as that functional form is known or can be determined. Further, the estimation of the function may be carried out only once and used for further imaging applications. It may also be tracked and refined continuously as more data is acquired during imaging. A key advantage of the method according to the present invention may be that it allows replacing hardware solutions that are typically used, and that may be complex and require elaborate operation, to be replaced by a software solution that may be portable and easy to use.

Overall, embodiments of the present technology thus aim to provide a method to correct for periodic external disturbances that may affect the resolution of a microscopy system and may help to further improve the resolution of the microscopy system.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be accidental. That is, unless otherwise specified or unless clear to the skilled person, the order in which steps are recited may be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

While in the above, preferred embodiments have been described with reference to the accompanying drawings, the skilled person will understand that these embodiments were provided for illustrative purpose only and should by no means be construed to limit the scope of the present invention, which is defined by the claims.

The microscopy system according to the present invention can be particularly configured to perform the method according to any of the preceding or below identified method embodiments.

Below is a list of method embodiments. Those will be indicated with a letter "M". Whenever such embodiments are referred to, this will be done by referring to "M" embodiments.

M1. A method for compensating interference in a microscopy system, the method comprising:

capturing data obtained from irradiation of a sample for a sampling duration, dividing at least representative parts of the sampling duration into relevant time-windows, constructing, for each of the relevant time-windows, an intermediate image, and detecting a shift between the intermediate images.

M2. The method according to the preceding method embodiment wherein the intermediate images are aligned and integrated or aggregated in order to enhance resolution, dynamic range, sharpness or any combination thereof.

M3. The method according to any of the preceding method embodiments wherein the intermediate image is constructed using data captured in the corresponding time-window.

M4. The method according to any of the preceding method embodiments further comprising compensating the interference in a charged particle beam microscopy system.

M5. The method according to any of the preceding method embodiments wherein a grade of compensation is pre-defined or can be varied.

M6. The method according to any of the preceding method embodiments further determining a compensation function for the shift between the intermediate images.

M7. The method according to the preceding method embodiment wherein the shift between intermediate images is a two-dimensional shift and the compensation function represents a shift of the intermediate images in the two dimensions over time.

M8. The method according to any of the preceding method embodiments wherein dividing at least representative parts of the sampling duration into a number of equally long time-windows (N).

M9. The method according to any of the 3 preceding method embodiments wherein the function is a periodic function.

M10. The method according to the preceding embodiment, wherein the method comprises determining a period of the periodic function.

M11. The method according to the preceding embodiment, wherein, for any defined time window, the intermediate image is constructed also from data captured in any of the time intervals of the same length as the defined time-window and separated from the defined window by an integral multiple of the period of the periodic function.

M12. The method according to any of the 3 preceding method embodiments wherein the function is a trigonometric function.

M13. The method according to the preceding method embodiment wherein the trigonometric function is a sinusoidal function with amplitude and phase data.

M14. The method according to any one of the preceding method embodiments further comprising the step of generating compensated image data on the basis of the data captured with a compensation of the interference according to the compensation function.

M15. The method according to any of the preceding method embodiments wherein the data captured comprises position data of a charged particle beam and/or sample holder in the microscopy system and wherein this position data is compensated by the compensation function over time.

M16. The method according to the preceding method embodiment further comprising the step of generating an image on the basis of the compensated image data.

M17. The method according to any of the preceding method embodiments further with the step of tracking the compensation of interference continuously and benchmarking the quality thereof.

M18. The method according to the preceding method embodiment with the further step of refining the compensation when the interference compensation benchmark steps over a threshold.

M19. The method according to the preceding method embodiment wherein the benchmark threshold is preset.

M20. The method according to any of the two preceding method embodiments wherein the benchmark comprises a dynamic value depending on the ratio of values of the data captured to the values of the shifts determined.

M21. The method according to any of the preceding method embodiments with the step of convolving at least two of the intermediate images.

M22. The method according to any of the preceding method embodiments further comprising tabulating the shift with respect to the reference window as a function of the time difference with respect to the reference window.

M23. The method according to any of the preceding method embodiment further comprising the step of defining a reference time window and with further tabulating each of the shifts as a function of the time difference with respect to the reference window.

M24. The method according to any of the preceding method embodiments with the further step of determining a compensation function for the shifts between the intermediate images and determining the compensation function using a machine learning method.

M25. The method according to any of the preceding method embodiments, wherein the microscopy system is configured for imaging and/or processing the sample, or parts thereof.

M26. The method according to any of the preceding method embodiments wherein the microscope is a charged particle beam microscope and an energy of particles in a beam of particles is generated with at most 50 keV, preferably at most 40 keV, further preferably at most 30 keV.

M27. The method according to any of the preceding method embodiments wherein the microscope is a charged particle beam microscope and the beam of particles comprises a current up to 19 pA for a beam energy of 15 keV, and up to 350 pA for a beam energy of 30 keV.

Below is a list of system embodiments. Those will be indicated with a letter "S". Whenever such embodiments are referred to, this will be done by referring to "S" embodiments.

S1. A microscopy system for compensating interference comprising:
a data storage configured for capturing data obtained from irradiation of a sample for a sampling duration, and
a processing component configured for
dividing at least representative parts of the sampling duration into relevant time-windows,
constructing, for each of the relevant time-windows, an intermediate image, and detecting a shift between the intermediate images.

S2. The system according to the preceding system embodiment further comprising compensating the interference in a charged particle beam microscopy system.

S3. The system according to any of the preceding system embodiments wherein the intermediate images are aligned and integrated or aggregated in order to enhance resolution, dynamic range, sharpness or any combination thereof.

S4. The system according to any of the preceding system embodiments wherein the processing component is configured to construct the intermediate image using data captured in the corresponding time-window.

S5. The system according to any of the preceding system embodiments wherein a grade of compensation is configured to be pre-defined or varied.

S6. The system according to any of the preceding system embodiments wherein the processing component is configured for further determining a compensation function for the shift between the intermediate images.

S7. The system according to the preceding system wherein the shift between intermediate images is a two-dimensional shift and the compensation function represents a shift of the intermediate images in the two dimensions over time.

S8. The system according to any of the preceding system embodiments wherein the processing component is configured for dividing at least representative parts of the sampling duration into a number of equally long time-windows (N).

S9. The system according to any one of the 3 preceding system embodiments wherein the function is a periodic function.

S10. The system according to the preceding system embodiment wherein the function is a trigonometric function.

S11. The system according to the preceding system embodiment wherein the trigonometric function is a sinusoidal function with amplitude and phase data.

S12. The system according to any one of the preceding system embodiments wherein the processing component is configured for further generating compensated image data on the basis of the data captured with a compensation of the interference according to the compensation function.

S13. The system according to any of the preceding system embodiments wherein the data captured comprises position data of a charged particle beam and/or sample holder in the microscopy system and wherein this position data is compensated by the compensation function over time.

S14. The system according to the preceding system embodiment wherein the processing component is configured for further generating an image on the basis of the compensated image data.

S15. The system according to any of the preceding system embodiments wherein the processing component is configured for further tracking the compensation of interference continuously and benchmarking a quality thereof.

S16. The system according to the preceding system embodiment wherein the processing component is configured for refining the compensation when the interference compensation benchmark moves over a threshold.

S17. The system according to the preceding system embodiment wherein the benchmark threshold is preset.

S18. The system according to any of the two preceding system embodiments wherein the benchmark comprises a dynamic value depending on the ratio of values of the data captured to the values of the shifts determined.

S19. The microscopy system according to any of the preceding system embodiments being configured to direct a beam of particles at a scan point on the sample to image it.

S20. The microscopy system according to the preceding embodiment wherein a result of the beam of particles striking the sample is emission of particles from the sample.

S21. The microscopy system according to the preceding embodiment comprising a detector configured to detect emissions from the sample.

S22. The microscopy system according to any of the 2 preceding embodiments, wherein the particles comprise electrons.

S23. The microscopy system according to the preceding embodiment wherein the detector is configured to detect a particle flux.

S24. The microscopy system according to the preceding embodiment with the data storage being configured to store data relating to the particle flux.

S25. The microscopy system according to any of the preceding system embodiments being configured to associate a 2-dimensional co-ordinate system with a surface of the sample exposed to the beam.

S26. The microscopy system according to the preceding system embodiment being configured to report 2-dimensional co-ordinates of the scan point.

S27. The microscopy system according to the preceding embodiment wherein the data relating to the particle flux comprises the 2-dimensional co-ordinates of the scan point.

S28. The microscopy system according to any of the preceding system embodiments with the data relating to the particle flux comprises data relating to a time of detection of the particle flux.

S29. The microscopy system according to any of the preceding system embodiments wherein the data processing unit is configured to exchange data with the memory unit.

S30. The microscopy system according to any of the preceding system embodiments being configured to perform the method according to any of the preceding method embodiments.

Below is a list of method embodiments. Those will be indicated with a letter "P". Whenever such embodiments are referred to, this will be done by referring to "P" embodiments.

P1. A computer program product comprising instructions, when run on a data processing unit, to perform the method according to any of the preceding method embodiments.

P2. A computer program product comprising instructions, when run on a data processing unit of a microscopy system according to any of the preceding system embodiments, to perform the method according to any of the preceding method embodiments.

The invention claimed is:

1. A computer program product comprising instructions that, when run on a processing unit of a charged particle beam microscopy system configured to acquire and compensate charged-particle-beam image data, cause the performance of a method for compensating external interference in a charged particle beam microscopy system in the image data, the method comprising:

capturing data obtained from irradiation of a sample for a sampling duration;

dividing at least representative parts of the sampling duration into time-windows, based on a nature of the external interference;

constructing an intermediate image for the time-windows of the representative parts, wherein, for any defined time window, the intermediate image is constructed also from data captured in any of the time intervals of the same length as the defined time-window and separated from the defined window by an integral multiple of a period of a periodic function;

detecting a shift between the intermediate images; and determining a compensation for the shift between the intermediate images.

2. The computer program product of claim 1, wherein the shift between intermediate images is a two-dimensional shift and the compensation comprises a compensation function representing the shift of the intermediate images in the two dimensions over time.

3. The computer program product of claim 1, wherein dividing at least representative parts of the sampling duration into a number of equally long time-windows (N).

4. The computer program product of claim 1, wherein the compensation comprises a compensation function representing the shift of the intermediate images in the two dimensions over time and wherein the compensation function is a periodic function.

5. The computer program product of claim 4, wherein the periodic function is a sine function with amplitude and phase data.

6. The computer program product of claim 1, wherein the compensation comprises a compensation function representing the shift of the intermediate images in the two dimensions over time, the method further comprising the step of generating compensated image data on the basis of the data captured with a compensation of the interference according to the compensation function.

7. The computer program product of claim 1, wherein the compensation comprises a compensation function representing the shift of the intermediate images in the two dimensions over time, and wherein the data captured comprises position data of a charged particle beam and/or sample holder in the microscopy system and wherein this position data is compensated by the compensation function over time.

8. A microscopy system for compensating external interference comprising:
   a data storage configured for capturing data obtained from irradiation of a sample for a sampling duration, and a processing component configured for:
   dividing at least representative parts of the sampling duration into time-windows based on whether the interference is an external interference, wherein, for any defined time window, the intermediate image is constructed also from data captured in any of the time intervals of the same length as the defined time-window and separated from the defined window by an integral multiple of a period of a periodic function;
   constructing, for each of the time-windows, an intermediate image; and
   detecting a shift between the intermediate images.

9. The system of claim 8, wherein the processing component is configured for further compensating the interference in a charged particle beam microscopy system.

10. The system of claim 8, wherein the processing component is configured for further determining a compensation function for the shift between the intermediate images.

11. The system of claim 10, wherein the processing component is configured for further generating compensated image data on the basis of the data captured with a compensation of the interference according to the compensation function.

12. The system of claim 10, wherein the data captured comprises position data of a charged particle beam and/or sample holder in the microscopy system and wherein this position data is compensated by the compensation function over time.

13. The system of claim 8, wherein the processing component is configured for determining a compensation function for the shift between the intermediate images by machine learning.

14. A computer program product comprising instructions that, when run on a processing unit of a charged particle beam microscopy system configured to acquire and compensate charged-particle-beam image data, cause the performance of a method for compensating external interference in a charged particle beam microscopy system in the image data, the method comprising:
   capturing data obtained from irradiation of a sample for a sampling duration;

dividing at least representative parts of the sampling duration into a number of equally long time-windows (N), based on a nature of the external interference;
   constructing an intermediate image for the time-windows of the representative parts;
   detecting a shift between the intermediate images; and
   determining a compensation for the shift between the intermediate images.

15. The computer program product of claim 14, wherein the shift between intermediate images is a two-dimensional shift and the compensation comprises a compensation function representing the shift of the intermediate images in the two dimensions over time.

16. The computer program product of claim 14, wherein the compensation comprises a compensation function representing the shift of the intermediate images in the two dimensions over time, wherein the compensation function is a periodic function, and wherein, for any defined time window, the intermediate image is constructed also from data captured in any of the time intervals of the same length as the defined time-window and separated from the defined window by an integer multiple of a period of a periodic function.

17. The computer program product of claim 14, wherein the compensation comprises a compensation function representing the shift of the intermediate images in the two dimensions over time and wherein the compensation function is a periodic function.

18. The computer program product of claim 17, wherein the periodic function is a sine function with amplitude and phase data.

19. The computer program product of claim 14, wherein the compensation comprises a compensation function representing the shift of the intermediate images in the two dimensions over time, the method further comprising the step of generating compensated image data on the basis of the data captured with a compensation of the interference according to the compensation function.

20. The computer program product of claim 14, wherein the compensation comprises a compensation function representing the shift of the intermediate images in the two dimensions over time, and wherein the data captured comprises position data of a charged particle beam and/or sample holder in the microscopy system and wherein this position data is compensated by the compensation function over time.

* * * * *